United States Patent [19]

Ebert et al.

[11] Patent Number: 5,497,103

[45] Date of Patent: Mar. 5, 1996

[54] TEST APPARATUS FOR CIRCUITIZED SUBSTRATE

[75] Inventors: William S. Ebert, Endicott; David E. Engle; Kishor V. Desai, both of Vestal; Thomas G. Macek, Endicott, all of N.Y.

[73] Assignee: International Business Machines Corporation, Armonk, N.Y.

[21] Appl. No.: 378,348

[22] Filed: Jan. 25, 1995

[51] Int. Cl.[6] .................................................. G01R 1/04
[52] U.S. Cl. ................................................... 324/754
[58] Field of Search ..................................... 324/757, 758, 324/72.5

[56] References Cited

U.S. PATENT DOCUMENTS

| | | |
|---|---|---|
| 4,926,117 | 5/1990 | Nevill . |
| 4,998,885 | 3/1991 | Beaman . |
| 5,090,118 | 2/1992 | Kwon et al. . |
| 5,092,774 | 3/1992 | Milan . |
| 5,109,596 | 5/1992 | Driller et al. ........................ 29/705 |
| 5,109,696 | 5/1992 | Driller et al. . |
| 5,166,605 | 11/1992 | Daum et al. . |
| 5,175,491 | 12/1992 | Ewers . |
| 5,225,037 | 7/1993 | Elder et al. . |
| 5,249,972 | 10/1993 | Walker . |
| 5,273,441 | 12/1993 | Volz et al. . |
| 5,317,255 | 5/1994 | Suyama et al. ...................... 324/72.5 |

FOREIGN PATENT DOCUMENTS

| | | |
|---|---|---|
| 57-45473 | of 1980 | Japan . |
| 4223658 | 1/1993 | Netherlands . |
| 2262384 | 11/1991 | United Kingdom . |

*Primary Examiner*—Kenneth A. Wieder
*Assistant Examiner*—Barry C. Bowser
*Attorney, Agent, or Firm*—Lawrence R. Fraley

[57] ABSTRACT

A test apparatus and method for testing circuitized substrates such as printed circuit boards or ceramic substrates having one or more chips thereon. The apparatus includes one substrate (e.g., printed circuit board) located on a base and adapted for having another circuitized substrate (e.g., flexible circuit) positioned thereon and electrically coupled to conductive elements (e.g., copper pads) thereof. Elastomeric members may be used to force the flexible circuit against the conductors of the substrate being tested, this substrate positioned either within or upon a cover which is located over the flexible circuit and which assists in compressing the flexible circuit against the printed circuit board's conductive elements to assure positive connection therewith. The cover may also include elastomeric members to facilitate such connection and a pivotal arm for being actuated to engage the substrate being tested. Positioning as well as relative quick separation (removal) of the substrate is attainable upon completion of the testing.

25 Claims, 3 Drawing Sheets

1

TEST APPARATUS FOR CIRCUITIZED SUBSTRATE

TECHNICAL FIELD

The subject invention relates to test apparatus and particularly to test apparatus for testing the operation of circuitized substrates. Even more particularly, the invention relates to such apparatus for testing such substrates wherein the substrate includes at least one semiconductor device (chip) forming a part thereof, e.g., by being electrically coupled thereto.

CROSS REFERENCE TO COPENDING APPLICATION

In Ser. No. 08/076,069, filed Jun. 11, 1993 and entitled "Method and Apparatus for Testing of Integrated Circuit Chips" (Inventors M. Anschel et al), there is described an apparatus and method for testing semiconductor chips wherein the fixture system's conductor pads are connected to the chip's contacts using contacts including dendritic elements. Ser. No. 08/076,069 is assigned to the same assignee as the present invention.

BACKGROUND OF THE INVENTION

It is known in the information handling system (computer) art to which this invention particularly pertains that the failure of a chip usually occurs during the initial phase of the chip's life. To test such components, a "burn-in" process is employed in which the chip is heated to high temperatures (greater than it would encounter during its life) and also electrically coupled to a test circuit or the like in which electrical current is passed through the chip. In one example, the chip may be heated in an oven established at an elevated temperature for a prolonged period, during or following which the chip is electrically coupled to a test circuit, e.g., such as found on a printed circuit board, and current applied. If the chip passes this testing, it is usually then mounted on and electrically coupled to an associated substrate such as a printed circuit board or ceramic substrate, both having circuitry on an upper surface thereof as well as possibly located internally. Often, more than one chip is mounted on a singular substrate, depending of course on the operational requirements of the information handling system which will utilize this assembly. Those assemblies with only one chip are often referred to in the industry as single chip modules while those with more than one chip are often referred to as multi-chip modules. It is understood that the present invention is adaptable for use with both types.

Various types of testing devices for testing semiconductors, semiconductor chip modules, and other electronic components are illustrated in Letters U.S. Pat. Nos. 5,090,118 (Kwon et al), 5,175,491 (Ewers), 5,225,037 (Elder et al), 5,249,972 (Walker), 5,273,441 (Volz et al) and German Offenlegungsschrift DE42 23 658 (von-Samson-Himmelstjerna et al), the latter describing the use of dendritic elements on a TAB (tape automated bonding) tape to connect this to the chip's contacts.

Various disadvantages of the aforementioned and other devices currently in use include complexity of structure, difficulty in assuring positive coupling between chip and associated circuitry providing the testing current, and in providing structure which facilitates ready separation of the chip (and perhaps its underlying substrate if in module form) following completion of the testing. The latter capability is particularly desired, especially to assure a module structure which can then be readily incorporated into the final system designed to utilize said structure.

It is believed, therefore, that a test apparatus for testing electronic components utilizing one or more semiconductor chips which can assure positive connection between the component and the test circuitry in addition to being readily separable to assure quick and repeated component separation from the test apparatus would constitute a significant advancement in the art. It is further believed that a method for testing chip components which provides such advantages would also constitute a significant art advancement.

It will be understood from the following that the invention is not solely limited to testing semiconductor chips but may be adaptable for use in testing a variety of circuitized substrates other than chips, examples being the aforementioned ceramic substrates, multi-layered circuit boards, etc.

DISCLOSURE OF THE INVENTION

It is therefore a primary object of the present invention to enhance the art of substrate testing, and particularly the testing of semiconductor chips and other circuitized substrates used in the computer field.

It is a more particular object of the invention to provide a test apparatus capable of testing circuitized substrates such as ceramic substrates and printed circuit boards having one or more chips as part thereof such that the apparatus can readily test the chip (s) and, simultaneously, the substrate, while assuring facile substrate removal and testing repeatability, e.g., of other substrates.

It is a further object of the invention to provide such a test apparatus which is of relatively simple construction, of relatively low cost, and which can be operated in a facile manner.

It is yet another object of the invention to provide a method for testing such circuitized substrates having one or more chips thereon or as part thereof which can be performed in a facile, yet relatively inexpensive manner.

The above and other objects of the invention are accomplished by one aspect of the invention wherein there is provided a substrate test apparatus comprising a base and a first resilient means positioned upon or within the base. The apparatus also comprises a second circuitized substrate adapted for being positioned on the base in an aligned manner therewith, the second circuitized substrate including a first plurality of conductive elements on a first surface thereof. In addition, the apparatus comprises a third circuitized substrate adapted for being positioned on the second circuitized substrate in aligned manner relative to the base and the second circuitized substrate, the third circuitized substrate being flexible in nature and including a first portion adapted for being positioned on the first resilient means and having a second plurality of conductive elements on a first surface thereof and a second portion having a third plurality of conductive elements on a second surface thereof opposite the first surface of the first portion. The second plurality of conductive elements are adapted for contacting the conductors on the first circuitized substrate and the third plurality of conductive elements of the third substrate are adapted for contacting the first plurality of conductive elements on the second circuitized substrate when the third circuitized substrate is positioned on the second circuitized substrate and the first circuitized substrate to be tested is positioned within or upon the test apparatus. Finally, the apparatus comprises a cover for being positioned on the third circuitized substrate in an aligned manner relative to the base, the cover adapted for engaging the second portion of the third circuitized substrate to force the third plurality of conductive elements against the first plurality of conductive elements, the cover adapted for having the first circuitized substrate positioned within or upon the cover.

Such objects are further accomplished by another aspect of the invention wherein there is provided a method for testing a circuitized substrate (e.g., printed circuit board or ceramic substrate), the method comprising a step of positioning a second circuitized substrate having a first plurality of conductive elements thereon on a base. Another step comprises positioning a third circuitized substrate having first and second portions each including a plurality of conductive elements thereon on the second circuitized substrate such that the plurality of conductive elements on the second portion engages the conductive elements on the second circuitized substrate. Additionally, the method comprises a step of positioning a cover on the third circuitized substrate in aligned manner relative to the base. The method also comprises the step of positioning the first circuitized substrate on or within the cover, selected ones of the conductors of the first circuitized substrate engaging respective ones of the conductive elements on the first portion of the third circuitized substrate when the cover is positioned on the circuitized substrate in the aligned manner relative to the base. Finally, the method comprises the step of applying electrical current to the second circuitized substrate whereby the current will pass to the conductors on the first circuitized substrate and the first circuitized substrate will be tested.

BEST MODE FOR CARRYING OUT THE INVENTION

For a better understanding of the present invention, together with other objects, advantages and capabilities thereof, reference is made to the following disclosure in combination with the above-described drawings.

Figure 1:
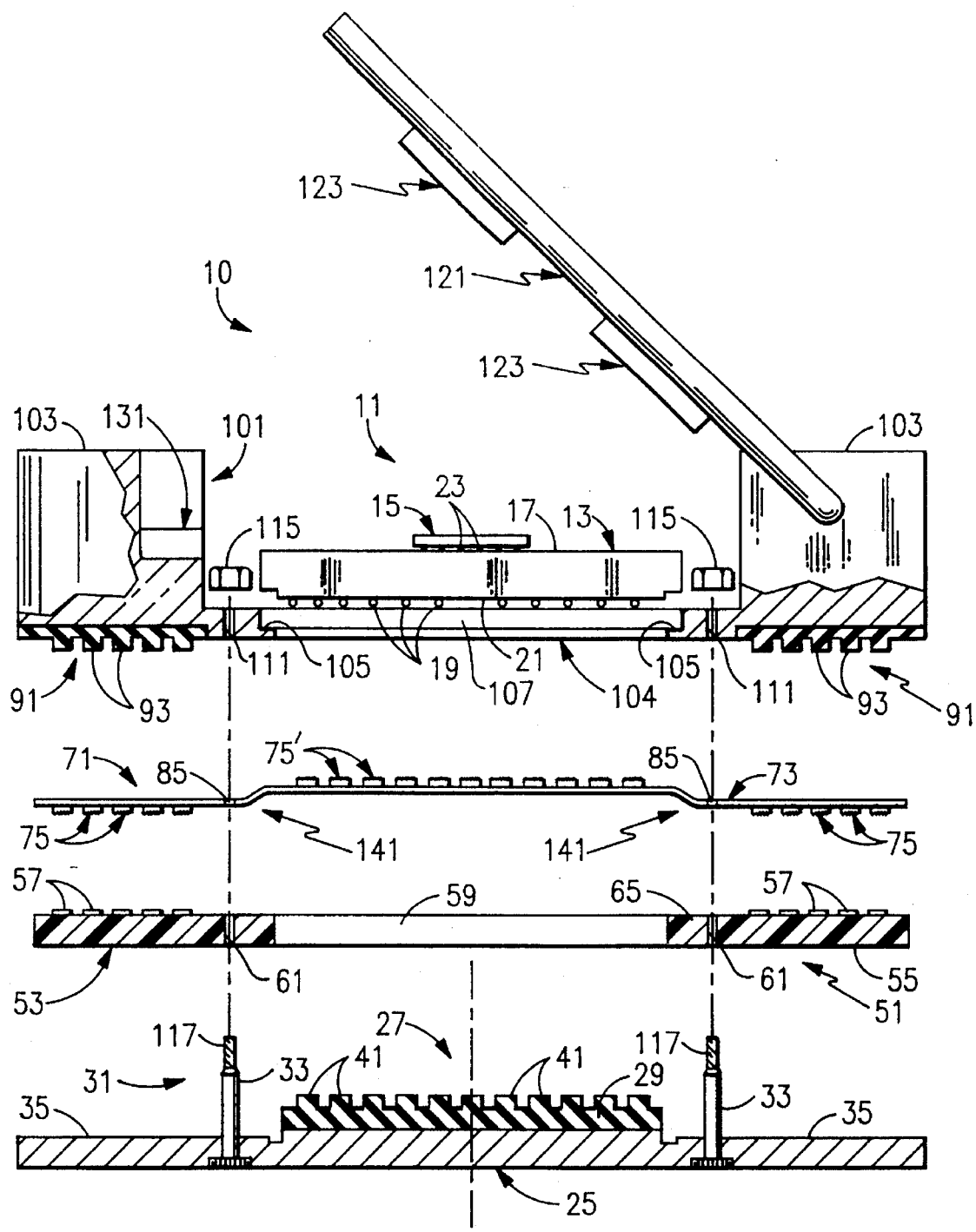
FIG. 1 is an exploded, side elevational view of a test apparatus in accordance with a preferred embodiment of the invention.

In FIG. 1, there is shown a test apparatus 10 in accordance with a preferred embodiment of the invention. As will be defined herein, test apparatus 10 is particularly designed for testing a first circuitized substrate 11 (e.g., ceramic substrate 13 having at least one (and perhaps more) semiconductor chips 15 positioned on an upper surface thereof and electrically coupled to the substrate's circuitry (not shown)). Circuitized substrates of this type are known in the art and typically include an insulative base for the substrate 13, the insulative material typically being a ceramic or polymer (e,g., fiberglass reinforced epoxy resin). Such substrates may include a plurality of conductive layers (e.g., signal, power, ground) therein as well as on the upper surface 17 thereof, this circuitry electrically coupled to the semiconductor device(s) 15 positioned thereon. In the embodiment depicted herein, the first circuitized substrate 11 further includes a plurality of solder elements 19 (e.g., spherical balls) located in a predetermined array along bottom surface 21. These solder elements 19 are conductors which are electrically coupled to the respective circuitry of the substrate (and thus further to the semiconductor device(s) 15). Conductors 19 may be positioned on surface 21 of substrate 11 in accordance with teachings known in the art. Similarly, the semiconductor device 15 is also preferably coupled to the corresponding circuitry of substrate 11 using a plurality of solder elements 23 (e.g., spherical balls).

The solder elements 19 and 23 may be of known solder material (e.g., 90:10 tin:lead, 63:37 tin:lead), further description not believed necessary.

Test apparatus 10 is further shown in FIG. 1 as including a base 25 having a first resilient means 27 positioned on an upper surface 29 thereof. Base 25 is preferably of stainless steel, but can be of any suitable material capable of providing rigidity to the extent required herein. Base 25 further includes alignment means 31 in the form of at least two projecting pins 33 which, as shown, are positioned within base 25 and project upwardly from external upper surfaces 35.

A preferred first resilient means 27 comprises an elastomeric (e.g., silicone rubber) member of bilayered construction so as to include a plurality of upper, spaced projections 41. Such an elastomeric structure may further include spaced openings (not shown) therein for assuring enhanced engagement when compressed. An example of such an elastomeric structure is defined in detail in U.S. Pat. Nos. 5,099,393 (Bentlage et al), and 5,059,129 (Brodsky et el). Additionally, it is also possible to utilize an elastomeric structure similar to that shown and described in U.S. Pat. No. 4,902,234 (Brodsky et al). The above three patents are all assigned to the same assignee as the present invention and are incorporated herein by reference. It is understood, however, that the invention is not limited to this particular construction for the invention's first resilient means 27, in that other resilient structures may be used.

Test apparatus 10 is further shown in FIG. 1 as including a second circuitized substrate 51 which, in a preferred embodiment, comprises a printed circuit board 53 having a dielectric (e.g., fiberglass-reinforced epoxy resin) member 55 and a first plurality of conductive elements (e.g., flat copper pads plated with nickel and gold) 57 oriented in a predetermined array along the outer portion of substrate 51. As further seen in FIG. 1, second substrate 51 also includes a central opening 59 and at least two spaced openings 61, openings 61 being particularly designed for having the projecting portions of pins 33 pass therethrough such that this second substrate 51 will be aligned relative to base 25. The materials for second substrate 51 can be those well known in the art and further description is not deemed necessary. In a preferred embodiment, substrate 51 possessed an overall thickness of about 1.6 millimeters (mm.). As seen when comparing FIGS. 1 and 2, the central aperture 59 is designed for accommodating the first resilient means 27 when substrate 51 is aligned on base 25. Significantly, the projecting portions 41 of resilient means 27 project above the plane of the upper surface 65 of substrate 51 when the substrate is aligned and positioned on surfaces 35 of base 25.

Figure 4:
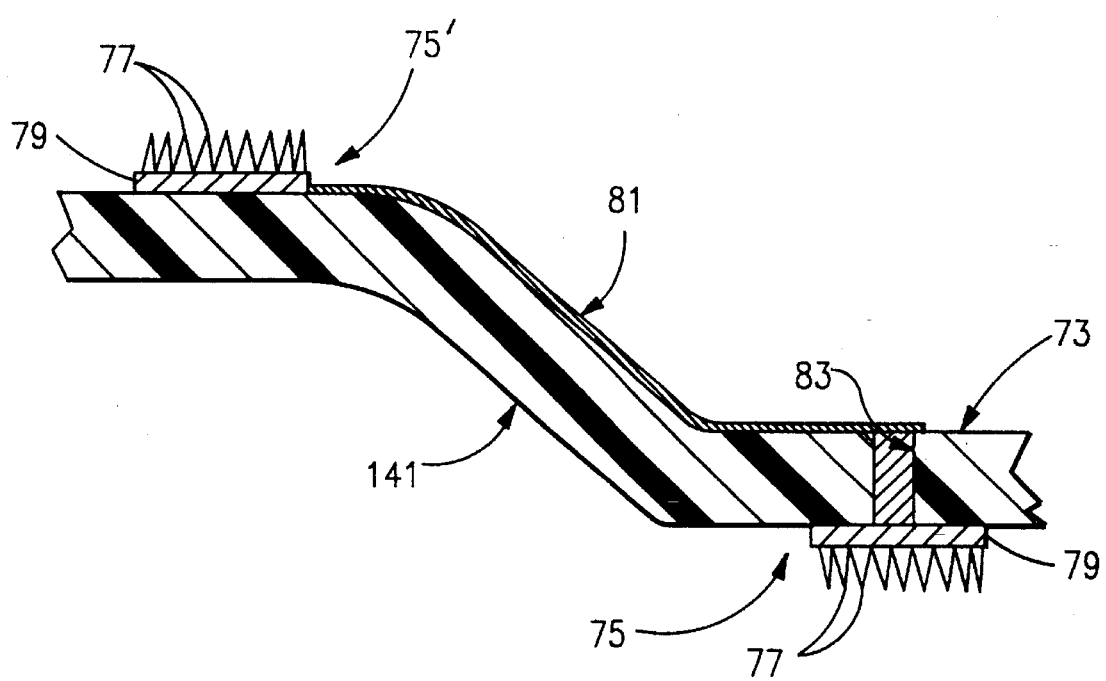
FIG. 4 is a much enlarged view of the invention's flexible third substrate showing the respective positioning of the opposing conductive elements thereof.

Test apparatus 10 further includes a third circuitized substrate 71 which, in accordance with the teachings herein, is comprised of a layer 73 of flexible dielectric material (e.g., polyimide). In one embodiment, the dielectric material 73 may possess a thickness of only about 0.05 mm. Significantly, this third circuitized substrate 71 includes a plurality of conductive elements 75 arranged in a predetermined array along the outer portions of dielectric 73. In a preferred embodiment, these conductive elements 75 include metallic (e.g., copper) pads of substantially flat configuration, each with a plurality of projecting dendritic elements 77 (FIG. 4) thereon. Each of these flat metallic pads is referenced by the numeral 79 in FIG. 4.

In accordance with a preferred embodiment of the invention, these dendritic elements 77 may be formed as defined in the teachings of U.S. Pat. Nos. 5,137,461 (Bindra et al) and 5,185,073 (Bindra et al). Both of these patents are assigned to the same assignee as the present invention and are incorporated herein by reference. In addition, these dendritic elements may be of the material and configuration defined in Canadian Patent 1,121,011 (Babuka et al) and its corresponding British Patent 1,568,464 (Babuka et al). Both of these patents are also assigned to the assignee as the present invention.

As defined in these patents, the dendritic (e.g., palladium) elements are capable of being "grown" in crystal-like configurations on a suitable metallic (e.g., copper) base pad. Significantly, these projecting dendritic elements are capable of intermeshing with similar elements of another connective structure to provide an effective, readily separable connection therebetween. As further understood, such dendritic elements can positively engage a flat metallic contact or the like, as well as a rounded or similar structure such as spherical solder elements of the type described herein. In all such forms of connection, effective electrical coupling is attainable in a sound manner that, significantly, enables facile separation when desired (e.g., test completion).

As seen in the drawings, substrate 75 includes a second plurality of conductive elements 75' spacedly positioned according to a predetermined pattern on a separate portion of the flexible substrate 71 than the corresponding conductive elements 75 located, as shown and described, along the outer, peripheral portion of substrate 71. Of further significance, the array of conductive elements 75' are located on an opposite surface of substrate 11 than the corresponding conductive elements 75. This relationship is better seen in the partial view of FIG. 4.

As understood, conductive elements 75 and 75' are electrically coupled, in one embodiment utilizing a layer of circuitry 81 (FIG. 4) located on an upper surface of the dielectric 73 and coupled through to the lower contact 75 using a plated or similarly conductive hole 83. This construction is not meant to limit the invention, in that other means for coupling the elements 75 and 75' can be utilized, including, e.g., an internal conductive layer. Circuitry 11, conductive hole 83, metallic pads 79 and the projecting dendritic elements 77 may be formed in accordance with teachings known in the art. Further description is thus not believed necessary.

Figure 2:
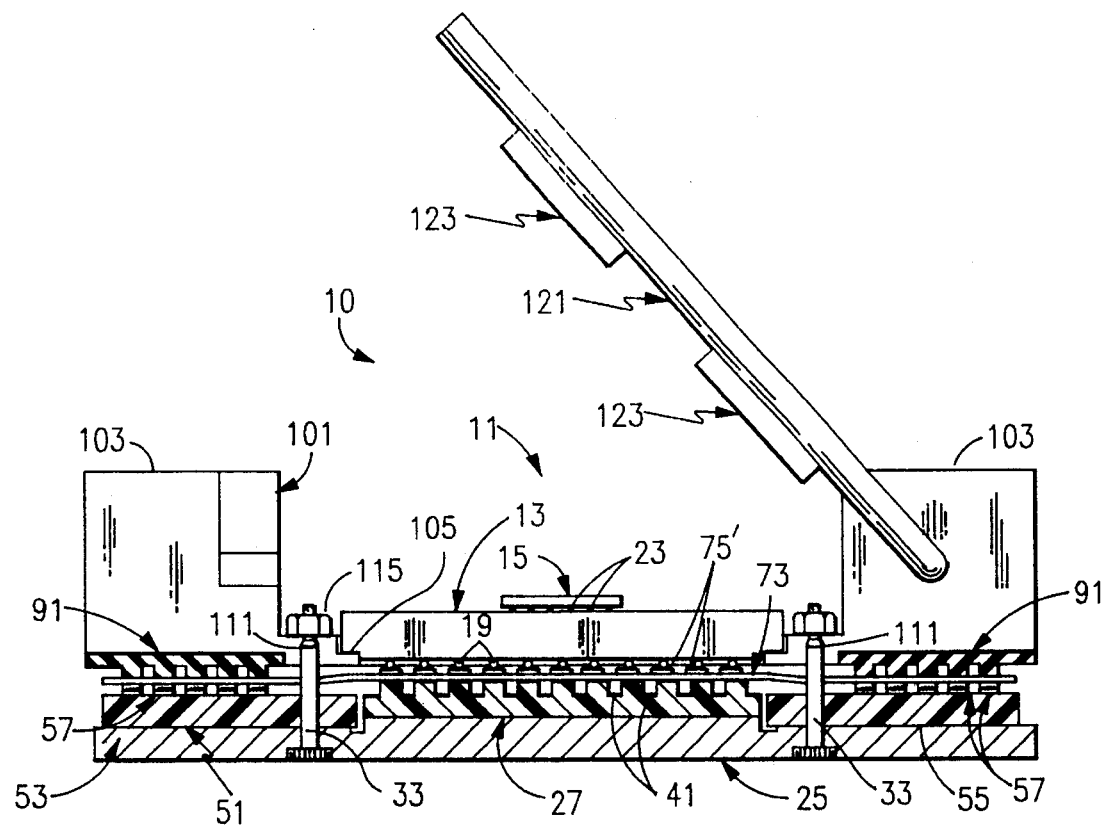
FIG. 2 is a side elevational view of the apparatus of FIG. 1 wherein a circuitized substrate is initially positioned in the apparatus prior to subsequent actuation of the apparatus.
Figure 3:
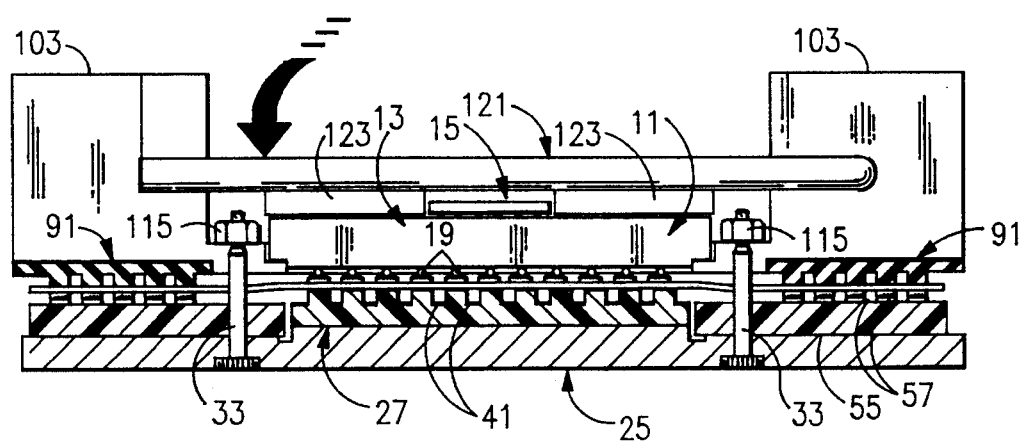
FIG. 3 is a side elevational view of the apparatus of FIG. 1 in the finally actuated position.

Of significance, selected ones of the invention's projecting elastomeric members 41 are designed for aligning with a respective one of the conductive elements 75' when the third circuitized substrate 71 is positioned within the apparatus (on substrate 51 when this substrate is positioned on base 25). This aligned relationship is best seen in FIGS. 2 and 3. Such alignment is attained using apertures 85 in dielectric 73 through which respective pins 33 will pass. As seen in FIGS. 2 and 3, the elastomeric projections 41 engage an opposite surface of dielectric 73 from the elements 75' and thus exert a force thereagainst when test apparatus 10 is actuated.

As further seen in FIGS. 1–3, apparatus 10 further includes second resilient means 91 which are adapted for engaging the upper surfaces of dielectric 73 to compress the outer portions of substrate 71 against substrate 51 such that contact between elements 75 and 57 is attained in a compressive manner.

In a preferred embodiment, each of the second resilient means 91 comprises a bilayered elastomeric member similar to that of first resilient means 27. As such, each means 91 includes a plurality of projecting elements 93, each of which is designed for aligning with a respective one of the conductive elements 75 and engaging an opposite surface of dielectric 73 to compress elements 75 against corresponding elements 57 on substrate 51.

As seen in FIGS. 1–3, test apparatus 10 further includes a cover 101 having enlarged outer portions 103 for strength and rigidity purposes. Interconnecting portions 103 is a central, planar portion 104 which in turn includes a shelf portion 105 extending substantially about a central aperture 107 formed in thinner portion 104. As seen, substrate 11 is designed for being positioned on shelf 105 to thereby position the substrate within (or upon) cover 101. In a preferred embodiment, cover 101 is comprised of stainless steel, but it is understood that other materials may be readily used. Further, cover 101 includes at least two spaced holes 111 portion 104 designed for having the projecting ends of pins 33 pass therethrough such that, when test apparatus 10 is finally assembled (e.g., FIG. 2) substrates 51 and 71, as well as cover 101, are precisely aligned relative to base 25. Because substrate 11 is positioned on or within cover 101 prior to assembly of apparatus 10, the lower conductors 19 are also aligned with the upwardly facing conductive elements 75' on flexible substrate 71. Thus, as seen in FIG. 2, conductive elements 75' compressingly engage the solder conductor elements 19 when test apparatus 10 is fully assembled (FIG. 3). At initial contact (FIG. 2) these solder conductive elements 19 merely rest atop the corresponding conductive elements 75'. However, the outer conductive elements 75 are compressed onto elements 55 at this initial stage, as also seen in FIG. 2. Such initial positioning is attained using a plurality of retention nuts 115, each of which is threaded onto respective threaded portions 117 of pins 33.

Following initial assembly and positioning of substrate 11 (FIG. 2), further compressive force is applied to substrate 11 to assure a more positive connection with the respective conductive elements 75'. In a preferred embodiment, such compression is attained using a pivotal arm 121 having a pair of spaced elastomers 123 thereon. Pivotal arm 121 pivots from one of the enlarged portions 103 of cover 101 and is designed for pivoting downwardly (FIG. 3) such that the elastomeric resilient members 123 on arm 121 physically engage and compress against the upper surface 17 of the insulative substrate 13. Arm 121 is preferably captured within a receiving slot 131 formed in the opposing, enlarged portion 103. Thus, to complete the connection of substrate 11 to test apparatus 10, this pivotal arm 121 is actuated by the test apparatus operator, following which electrical current from an associated test circuit (not shown) may be applied to second substrate 51 (e.g., using an external connector, several of which are known in the art). As so assembled, this test circuit current passes through substrates 51 and 71 and thus to conductors 19 of substrate 11, where it may eventually pass to the circuitry within semiconductor device 15 such that testing thereof can also be accomplished. Following such testing, pivotal arm 121 is pulled upwardly and substrate 11 is then capable of being readily removed from apparatus 10 and a second substrate (not shown) positioned therein. As understood, this second substrate will also be coupled to conductive elements 75' of the flexible substrate 71, pivotal arm 121 again then lowered to capture this new substrate within the test apparatus. Testing of such a second substrate can now occur, whereupon said substrate may then be removed and yet another substrate positioned and tested in accordance with the teachings herein.

In accordance with the unique teachings herein, substrate 71 is, as defined, flexible in nature and, significantly, includes a compliant portion 141 (see also FIG. 4) which is located substantially along the outer periphery of the portion of substrate 11 having conductive elements 75' thereon but inwardly of the outermost, peripheral portion of substrate 71 having the other plurality of conductive elements 75 thereon. Such compliancy assures precise coupling between the conductive elements of substrates 11 and 71, while simultaneously assuring flexure of this portion of substrate 71 as is essential when compressed against insulation means 27. Precisely aligned coupling between relatively highly dense conductive structures (75' and 19) is thus attainable in a readily separable manner while still assuring compliancy of at least one part (substrate 71) of the invention. Such compliancy is deemed necessary to facilitate deformation of the inner portion of the substrate (71) such that the array of conductive elements 75' will conform to the array of solder elements 19. Further, this compliant portion 141 enables compression of the elastomeric projections 41 independently of effects generated by the attachment of the outer portion of substrate 71 to the printed circuit board 53.

Thus there has been shown and described a test apparatus and associated method wherein a circuitized substrate can be readily tested in a separable, yet highly precise manner. It is anticipated that test apparatus 10 described herein can readily accommodate a single substrate 11. An even greater number of substrates (e.g., approximately 4 to 6) could be accommodated in a simultaneous manner by modification of the apparatus to include multiple test locations. The invention as described is capable of being operated in a relatively easy manner and, as shown, of relatively simplistic and less expensive construction in comparison to many known test apparatus of the prior art.

While there have been shown and described what are at present considered the preferred embodiments of the invention, it will be obvious to those skilled in the art that various changes and modifications may be made therein without departing from the scope of the invention as defined by the appended claims.

What is claimed is:

1. A test apparatus for testing a first circuitized substrate having a plurality of conductors, said test apparatus comprising:

a base;

first resilient means positioned upon or within said base;

a second circuitized substrate adapted for being positioned on said base in an aligned manner therewith, said second circuitized substrate including a first plurality of conductive elements on a first surface thereof;

a third circuitized substrate adapted for being positioned on said second circuitized substrate in aligned manner relative to said base and said second circuitized substrate, said third circuitized substrate being flexible in nature and including a first portion adapted for being positioned on said first resilient means and having a second plurality of conductive elements on a first surface thereof and a second portion having a third plurality of conductive elements on a second surface thereof opposite said first surface of said first portion, said second plurality of conductive elements contacting said conductors on said first circuitized substrate and said third plurality of conductive elements of said third substrate contacting said first plurality of conductive elements on said second circuitized substrate when said third circuitized substrate is positioned on said second circuitized substrate and said first circuitized substrate is positioned within or upon said test apparatus; and a cover for being positioned on said third circuitized substrate in an aligned manner relative to said base, said cover adapted for engaging said second portion of said third circuitized substrate to force said third plurality of conductive elements against said first plurality of conductive elements of said second circuitized substrate, said cover adapted for having said first circuitized substrate positioned within or upon said cover.

2. The test apparatus of claim 1 wherein said base includes alignment means for aligning said second and third substrates and said cover relative to said base.

3. The test apparatus of claim 2 where in said alignment means comprises at least two projecting pins, each of said pins adapted for aligning with corresponding apertures within said second and third circuitized substrates and said cover.

4. The test apparatus of claim 1 wherein said first resilient means comprises an elastomeric member.

5. The test apparatus of claim 4 wherein said elastomeric member includes a plurality of projections thereon, selected ones of said projections adapted for aligning with a respective one of said conductive elements of said second plurality of conductive elements of said third circuitized substrate.

6. The test apparatus of claim 1 wherein said second circuitized substrate comprises a printed circuit board.

7. The test apparatus of claim 1 wherein selected ones of said first plurality of conductive elements each comprises a metallic pad.

8. The test apparatus of claim 1 wherein selected ones of said second plurality of conductive elements each comprises a plurality of projecting dendritic elements.

9. The test apparatus of claim 8 wherein selected ones of said third plurality of conductive elements each comprises a plurality of projecting dendritic elements.

10. The test apparatus of claim 1 wherein said cover includes a shelf portion adapted for having said first circuitized substrate positioned thereon.

11. The test apparatus of claim 1 wherein said cover includes a pivotal arm for engaging said first circuitized substrate to force said first circuitized substrate against said first portion of said third circuitized substrate.

12. The test apparatus of claim 1 wherein said first portion of said third circuitized substrate is compliant in nature to allow movement of said first portion during said positioning of said third circuitized substrate on said second circuitized substrate and said cover on said third circuitized substrate.

13. The test apparatus of claim 12 wherein said third circuitized substrate includes a layer of dielectric material having said second and third pluralities of conductive elements positioned thereon.

14. The test apparatus of claim 13 wherein selected ones of conductive elements of said second and third pluralities on conductive elements each includes a plurality of projecting dendritic elements.

15. The test apparatus of claim 1 further including second resilient means positioned upon or within said cover and adapted for engaging said second portion of said third circuitized substrate when said cover is positioned on said third circuitized substrate.

16. The test apparatus of claim 15 wherein said second resilient means comprises an elastomeric member having a plurality of projections thereon, selected ones of said projections adapted for aligning with a respective one of said conductive elements of said third plurality of conductive elements when said cover is positioned on said third circuitized substrate.

17. The test apparatus of claim 1 wherein said first circuitized substrate adapted for being tested by said test apparatus comprises a circuit member having at least one semiconductor device positioned thereon.

18. The test apparatus of claim 17 wherein said circuit member comprises a ceramic member, selected ones of said conductors each comprising a solder element.

19. A method for testing a first circuitized substrate, having a plurality of conductors, said method comprising the steps of:

positioning a second circuitized substrate having a first plurality of conductive elements thereon on a base;

positioning a third circuitized substrate having first and second portions each including a plurality of conductive elements thereon on said second circuitized substrate such that said plurality of conductive elements on said second portion engages said conductive elements on said second circuitized substrate;

positioning a cover on said third circuitized substrate in aligned manner relative to said base;

positioning said first circuitized substrate on or within said cover, selected ones of said conductors of said first circuitized substrate engaging respective ones of said conductive elements on said first portion of said third circuitized substrate when said cover is positioned on said circuitized substrate in said aligned manner relative to said base; and applying electrical current to said second circuitized substrate whereby said current will pass to said conductors on said first circuitized substrate and said first circuitized substrate will be tested.

20. The method of claim 19 further including positioning a first resilient means on said base before positioning said second circuitized substrate on said base.

21. The method of claim 20 further including positioning said first portion of said third circuitized substrate on said first resilient means.

22. The method of claim 19 further including positioning a second resilient means on said cover prior to positioning said cover on said third circuitized substrate.

23. The method of claim 19 further including engaging said first circuitized substrate with an arm member to compress said first circuitized substrate against said third circuitized substrate.

24. The method of claim 19 further including the step of clamping said cover to said base when said cover is positioned on said third circuitized substrate.

25. The method of claim 19 further including electrically coupling a semiconductor device onto said first circuitized substrate prior to positioning said first circuitized substrate within or upon said test apparatus.

* * * * *